(12) United States Patent
Tanimoto

(10) Patent No.: US 12,074,038 B2
(45) Date of Patent: Aug. 27, 2024

(54) METHOD OF MANUFACTURING PASSIVATION FILM

(71) Applicant: SHOWA DENKO K.K., Tokyo (JP)

(72) Inventor: Yosuke Tanimoto, Tokyo (JP)

(73) Assignee: Resonac Corporation, Tokyo (JP)

( * ) Notice: Subject to any disclaimer, the term of this patent is extended or adjusted under 35 U.S.C. 154(b) by 475 days.

(21) Appl. No.: 17/612,783

(22) PCT Filed: Nov. 24, 2020

(86) PCT No.: PCT/JP2020/043674
§ 371 (c)(1),
(2) Date: Nov. 19, 2021

(87) PCT Pub. No.: WO2021/124810
PCT Pub. Date: Jun. 24, 2021

(65) Prior Publication Data
US 2022/0246447 A1    Aug. 4, 2022

(30) Foreign Application Priority Data

Dec. 17, 2019 (JP) .................................. 2019-227381

(51) Int. Cl.
*H01L 21/56* (2006.01)
*C23C 8/28* (2006.01)

(52) U.S. Cl.
CPC ............. *H01L 21/568* (2013.01); *C23C 8/28* (2013.01)

(58) Field of Classification Search
CPC ....... C23C 14/5866; C23C 8/16; C23C 28/34; H01L 21/02488; H01L 21/02381; H01L 21/02568; H01L 21/28247; H01L 21/306
See application file for complete search history.

(56) References Cited

U.S. PATENT DOCUMENTS 5,958,358 A * 9/1999 Tenne ..................... C30B 25/02
117/921
11,469,079 B2 * 10/2022 Eason ............... H01J 37/32798
(Continued)

FOREIGN PATENT DOCUMENTS

CN          102698794 A      10/2012
EP          0 968 052 B1     10/2003
(Continued)

OTHER PUBLICATIONS

International Search Report dated Dec. 28, 2020 from the International Searching Authority in International Application No. PCT/JP2020/043674.

(Continued)

*Primary Examiner* — Jaehwan Oh
(74) *Attorney, Agent, or Firm* — Sughrue Mion, PLLC

(57) ABSTRACT

A method of manufacturing a passivation film, which includes a passivation process in which a substrate on the surface of which at least one of germanium and molybdenum is contained is treated with a passivation gas containing an oxygen-containing compound, which is a compound containing an oxygen atom in the molecule, and hydrogen sulfide to form a passivation film containing a sulfur atom on the surface of the substrate. The concentration of the oxygen-containing compound in the passivation gas is from 0.001 mole ppm to less than 75 mole ppm.

11 Claims, 2 Drawing Sheets

(56) References Cited

U.S. PATENT DOCUMENTS

| | | | |
|---|---|---|---|
| 2007/0093074 A1* | 4/2007 | Frank | H01L 21/02052 |
| | | | 257/E21.396 |
| 2014/0027884 A1 | 1/2014 | Tang et al. | |
| 2014/0065798 A1* | 3/2014 | Ahmed | H01L 21/28194 |
| | | | 118/719 |
| 2016/0013048 A1 | 1/2016 | Gaylord et al. | |
| 2016/0042966 A1* | 2/2016 | Kelly | H01L 21/28255 |
| | | | 438/706 |
| 2017/0190921 A1* | 7/2017 | Ul Hamid | C23C 28/322 |
| 2017/0229314 A1* | 8/2017 | Tan | H01J 37/321 |
| 2018/0108587 A1* | 4/2018 | Jiang | H01L 21/67017 |
| 2018/0216232 A1 | 8/2018 | Sundaram | |
| 2018/0269070 A1* | 9/2018 | Eason | H01L 21/31116 |
| 2019/0165171 A1* | 5/2019 | Huang | H01L 21/76829 |
| 2019/0185323 A1* | 6/2019 | Tanimoto | F17C 1/14 |
| 2020/0168462 A1* | 5/2020 | Romero | H01L 21/02304 |
| 2023/0084901 A1* | 3/2023 | Eason | H01J 37/32522 |
| | | | 438/724 |

FOREIGN PATENT DOCUMENTS

| | | |
|---|---|---|
| JP | 02-141406 A | 5/1990 |
| JP | 07-69782 A | 3/1995 |
| JP | 2007-123895 A | 5/2007 |
| JP | 2016-207789 A | 12/2016 |
| JP | 2017-61743 A | 3/2017 |
| TW | 201411839 A | 3/2014 |
| TW | 201611119 A | 3/2016 |
| WO | 2017/221594 A1 | 12/2017 |

OTHER PUBLICATIONS

Woanseo Park, et al., "Oxygen environmental and passivation effects on molybdenum disulfide field effect transistors", Nanotechnology, 2013, vol. 24, 095202, 1-5 (6 pages).

International Preliminary Report on Patentability (with translation of Written Opinion) dated May 17, 2022, issued in International Application No. PCT/JP2020/043674.

Hamed Simchi et al., "Improved Performance of Ultrathin Cu(InGa)Se2 Solar Cells With a Backwall Superstrate Configuration," IEEE Journal of Photovoltaics, vol. 4, No. 6, Nov. 2014, pp. 1630-1635 (6 pages total).

* cited by examiner

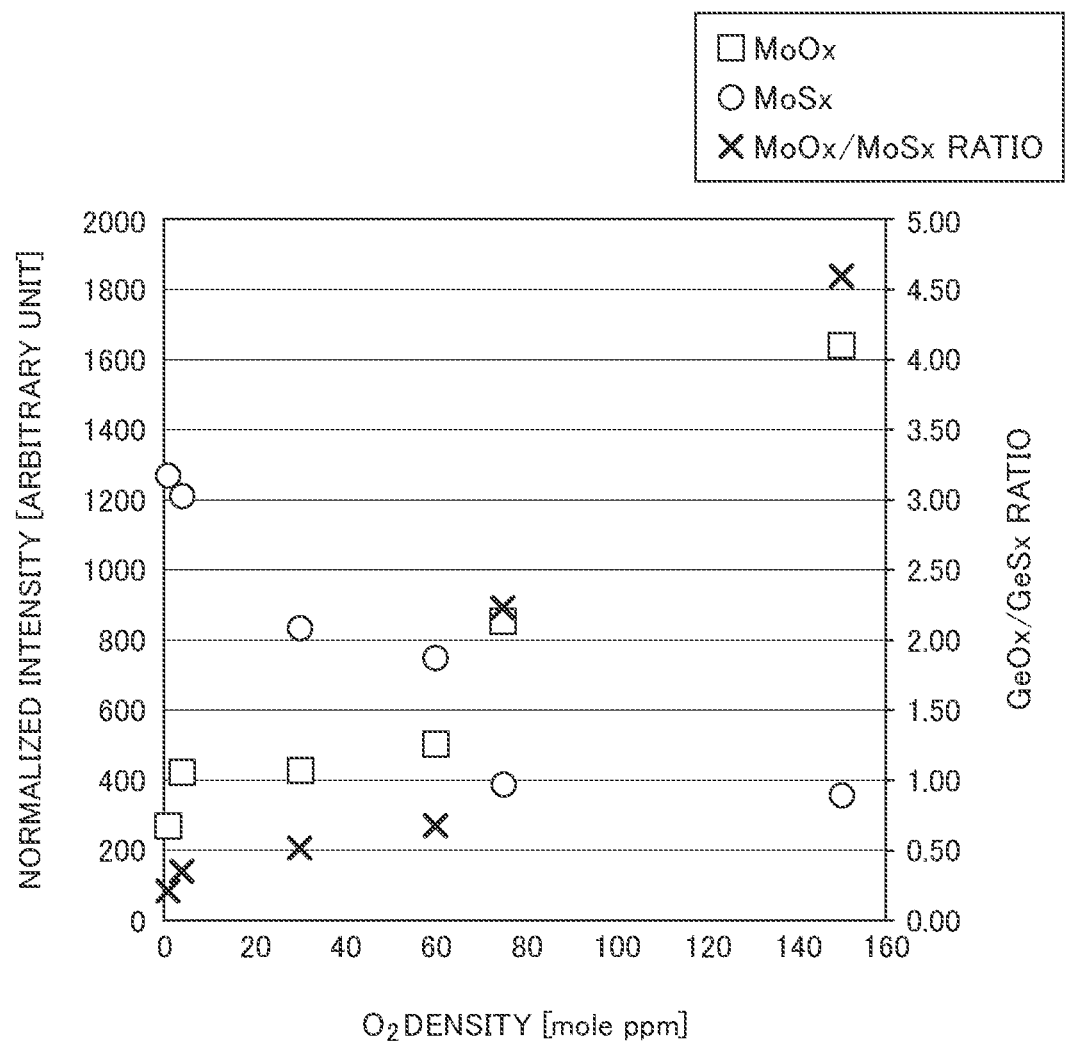

METHOD OF MANUFACTURING PASSIVATION FILM

CROSS REFERENCE TO RELATED APPLICATIONS

This application is a National Stage of International Application No. PCT/JP2020/043674, filed Nov. 24, 2020, claiming priority to Japanese Patent Application No. 2019-227381, filed Dec. 17, 2019.

TECHNICAL FIELD

The present invention relates to a method of manufacturing passivation films.

BACKGROUND ART

In recent years, semiconductor materials containing elements other than silicon (Si) have been attracting attention in the field of semiconductors. Examples of semiconductor materials containing elements other than silicon include semiconductor materials containing Group III-V elements such as germanium (Ge) and indium gallium arsenide (InGaAs), and semiconductor materials containing metal chalcogenides such as molybdenum (IV) sulfide ($MoS_2$).

Although these semiconductor materials have an advantage of having a high mobility compared to silicon materials, the mobility may be reduced due to difficulties in film formation or high defect density at the interface between materials.

Therefore, in order to lower the defect density at the interface between materials, a method of forming a passivation film on a germanium or molybdenum substrate using hydrogen sulfide ($H_2S$) gas has been proposed (see, for example, Patent Document 1). As a method of depositing metal chalcogenides, a method of treating a molybdenum oxide layer and a tungsten oxide layer with hydrogen sulfide gas to form a molybdenum sulfide layer and a tungsten sulfide layer has been proposed (see, for example, Patent Document 2).

CITATION LIST

Patent Literature

PTL 1: JP 2016-207789 A
PTL 2: JP 2017-61743 A

SUMMARY OF INVENTION

Technical Problem

However, depending on the quality of a hydrogen sulfide gas, the concentration of oxygen atoms contained in a passivation film may increase, resulting in a decrease in the performance of the passivation film.

The present invention aims to provide a method for manufacturing a passivation film that can reproducibly produce a passivation film with a low concentration of oxygen atoms.

Solution to Problem

In order to solve the above-described problems, one aspect of the present invention is as described in [1] to [5] below.

[1] A method of manufacturing a passivation film, the method including
a passivation process in which a substrate on the surface of which at least one of germanium and molybdenum is contained is treated with a passivation gas containing an oxygen-containing compound, which is a compound containing an oxygen atom in a molecule, and hydrogen sulfide to form a passivation film containing a sulfur atom on the surface of the substrate, wherein
concentration of the oxygen-containing compound in the passivation gas is from 0.001 mole ppm to less than 75 mole ppm.
[2] The method of manufacturing a passivation film according to [1], wherein the concentration of the oxygen-containing compound in the passivation gas is from 0.5 mole ppm to 65 mole ppm.
[3] The method of manufacturing a passivation film according to [1] or [2], wherein the oxygen-containing compound is at least one of oxygen gas and water.
[4] The method of manufacturing a passivation film according to any one of [1] to [3], wherein the substrate includes a film containing at least one of germanium and molybdenum on the surface of the substrate.
[5] The method of manufacturing a passivation film according to any one of [1] to [4], wherein the substrate is treated with the passivation gas under conditions of a temperature of from 20° C. to 1,500° C. and a pressure of from 1 Pa to 101 kPa.

Advantageous Effects of Invention

According to the present invention, a passivation film with a low concentration of oxygen atoms can be reproducibly manufactured.

BRIEF DESCRIPTION OF DRAWINGS

FIG. 3 is a graph illustrating an analysis result of surface states of a molybdenum film on which a passivation film is formed.

DESCRIPTION OF EMBODIMENTS

Figure 1:
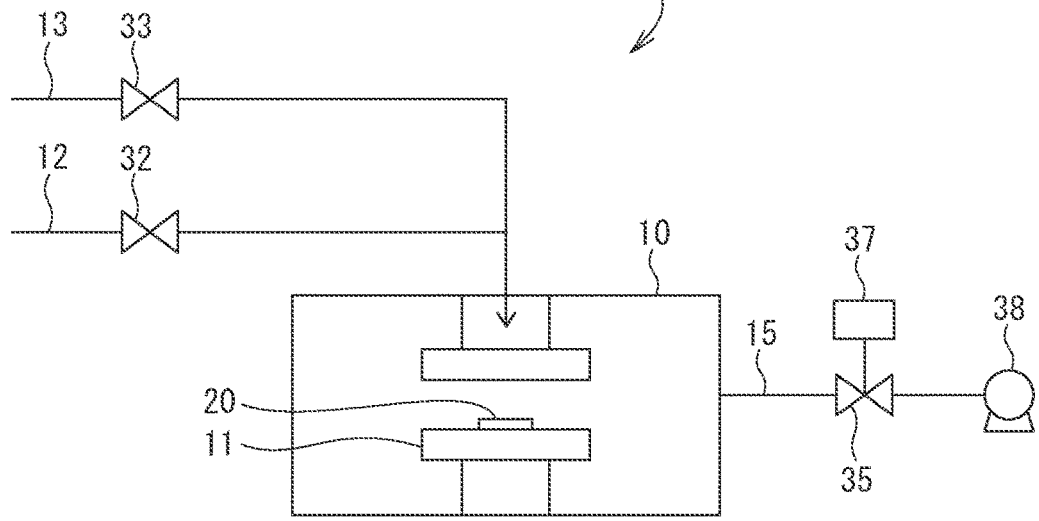
FIG. 1 is a schematic diagram of a film deposition system illustrating an embodiment of the method of manufacturing a passivation film according to the present invention.

An embodiment of the present invention will be described below. The present embodiment is an example of the present invention, and the present invention is not limited to the present embodiment. A variety of modifications or improvements can be made to the present embodiment, and such an aspect in which a modification or improvement is made can be included in the present invention.

The method for manufacturing a passivation film according to the present embodiment includes a passivation process in which a substrate on the surface of which at least one of germanium and molybdenum is contained is treated with a passivation gas containing an oxygen-containing compound, which is a compound containing an oxygen atom in a molecule, and hydrogen sulfide to form a passivation film containing a sulfur atom on the surface of the substrate.

Concentration of the oxygen-containing compound in the passivation gas is from 0.001 mole ppm to less than 75 mole ppm.

According to the method of manufacturing a passivation film according to the present embodiment, a stable sulfide film can be generated while suppressing unintended generation of an oxide film, and therefore a passivation film with a low concentration of oxygen atoms can be reproducibly manufactured.

In order to sufficiently suppress generation of unintended oxide films and to reproducibly produce a passivation film with a low concentration of oxygen atoms, the concentration of the oxygen-containing compound in the passivation gas needs to be from 0.001 mole ppm to less than 75 mole ppm, and the upper limit is preferably 65 mole ppm or less, more preferably 40 mole ppm or less, and still more preferably 5 mole ppm or less, and the lower limit may be 0.5 mole ppm or more. The lower the concentration of oxygen-containing compounds in the passivation gas, the more favorable, but when the concentration is lower than 0.001 mole ppm, measurement is difficult.

The kind of an oxygen-containing compound is not particularly limited, and examples thereof include oxygen gas ($O_2$), water ($H_2O$), carbon monoxide (CO), carbon dioxide ($CO_2$), carbonyl sulfide (COS), and sulfur dioxide ($SO_2$). Among these oxygen-containing compounds, at least one of oxygen gas and water is preferable.

A substrate to be treated with a passivation gas is a substrate on the surface of which at least one of germanium and molybdenum is contained, and how the surface of the substrate has at least one of germanium and molybdenum is not particularly limited. For example, the surface of the substrate may include a film containing at least one of germanium and molybdenum.

A substrate including a film containing at least one of germanium and molybdenum on the surface may be any substrate as long as the film contains at least one of germanium and molybdenum, and is suitably, for example, a substrate used for forming semiconductor devices. In particular, a single crystal silicon substrate on which a film containing at least one of germanium and molybdenum is deposited on the surface by physical vapor deposition (PVD) or chemical vapor deposition (CVD) is preferable.

The concentration of hydrogen sulfide in a passivation gas is not particularly limited as long as the amount is sufficient for depositing a passivation film, and is preferably 1% or more by volume, more preferably 2% or more by volume, still more preferably 10% or more by volume, and particularly preferably 100% by volume. A component contained in the passivation gas other than hydrogen sulfide and oxygen-containing compounds is not particularly limited, and examples thereof include an inert gas such as nitrogen gas or argon gas.

The pressure at which a substrate is treated with a passivation gas in a passivation process (for example, the pressure in a chamber where a treatment with the passivation gas takes place) is not particularly limited, and is preferably from 1 Pa to 101 kPa, more preferably from 10 Pa to 90 kPa, and still more preferably from 100 Pa to 80 kPa.

The temperature at which a substrate is treated with a passivation gas in a passivation process (for example, the temperature of the substrate distributed in a chamber) is not particularly limited, and in order to obtain high in-plane uniformity of the treatment of the surface of the substrate by the passivation gas, the temperature is preferably from 20° C. to 1,500° C., more preferably from 50° C. to 1,200° C., and still more preferably from 100° C. to 1,000° C.

Furthermore, the length of time for treating a substrate with a passivation gas in a passivation process is not particularly limited, and in consideration of the efficiency of a semiconductor device manufacturing process, the length of time is preferably within 120 minutes. The time to treat a substrate with a passivation gas refers to the time from the time when the passivation gas is supplied to a chamber in which the substrate is housed to the time when the passivation gas in the chamber is evacuated by a vacuum pump or the like to finish the treatment of the surface of the substrate by the passivation gas.

The method of manufacturing a passivation film according to present embodiment can be suitably applied to a semiconductor film deposition system for depositing a passivation film on the surface of a substrate. The structure of this film deposition system is not particularly limited, and the positional relationship between the substrate housed in the chamber, which is a reaction vessel, and a piping connected to the chamber is not particularly limited.

EXAMPLES

Hereinafter, the present invention will be described in more detail with reference to Examples and Comparative Examples.

Example 1

A passivation film was formed on the surface of a substrate using a film deposition system 1 illustrated in FIG. 1. The film deposition system 1 includes a chamber 10 for performing a passivation process and a temperature control device (not illustrated) for adjusting the temperature inside the chamber 10. Inside the chamber 10, a stage 11 for supporting a sample 20 is provided. As the sample 20, a silicon oxide film having a thickness of 150 nm was formed on a silicon substrate, and a germanium film having a thickness of 80 nm was further formed on top of the silicon oxide film.

On the upstream side of the chamber 10, a passivation gas supply piping 12 for supplying a passivation gas containing an oxygen-containing compound and hydrogen sulfide to the chamber 10 and an inert gas supply piping 13 for supplying an inert gas to the chamber 10 are connected via a valve 32 and a valve 33, respectively.

On the downstream side of the chamber 10, an exhaust piping 15 for discharging a gas inside the chamber 10 to the outside is connected to the chamber 10, and on the downstream side of the exhaust piping 15, a vacuum pump 38 is connected via a valve 35. The pressure inside the chamber 10 is controlled by a pressure controller 37 that controls the valve 35.

The film deposition system 1 as described above was used to perform a passivation process. A sample 20 was placed on a stage 11, the pressure in a chamber 10 was reduced to less than 10 Pa, and then the temperature in the chamber 10 was raised to 800° C. Then, the valve 32 was opened, and a passivation gas was supplied from the passivation gas supply piping 12 to the chamber 10 at a pressure of 101 kPa. This passivation gas is a mixture of oxygen gas and hydrogen sulfide gas, and the concentration of oxygen gas in the passivation gas is 60 mole ppm. The flow rate of the passivation gas was set to 100 sccm, and the pressure inside the chamber 10 when depositing a passivation film on the surface of the sample 20 was set to 67 kPa. It is noted that sccm represents the flow rate (ml/min) at 0° C. and 101.3 kPa.

After the passivation gas was introduced for 30 minutes to sulfurize the surface of the sample 20 and deposit a passivation film under conditions of a temperature of 800° C. and a pressure of 67 kPa, the introduction of the passivation gas was stopped. Then, the inside of the chamber 10 was evacuated with the vacuum pump 38, and nitrogen gas which is an inert gas was supplied into the chamber 10 from the inert gas supply piping 13 to replace the inside of the chamber 10 with nitrogen gas. The temperature inside the chamber 10 was then lowered to room temperature, and the sample 20 on which the passivation film was deposited was removed from the chamber 10.

Example 2

A passivation film was deposited on the surface of a substrate in the same manner as in Example 1, except that the concentration of oxygen gas in a passivation gas was set to 30 mole ppm.

Example 3

A passivation film was deposited on the surface of a substrate in the same manner as in Example 1, except that the concentration of oxygen gas in a passivation gas was set to 3.8 mole ppm.

Example 4

A passivation film was deposited on the surface of a substrate in the same manner as in Example 1, except that the concentration of oxygen gas in a passivation gas was set to 0.75 mole ppm.

Comparative Example 1

A passivation film was deposited on the surface of a substrate in the same manner as in Example 1, except that the concentration of oxygen gas in a passivation gas was set to 75 mole ppm.

Comparative Example 2

A passivation film was deposited on the surface of a substrate in the same manner as in Example 1, except that the concentration of oxygen gas in a passivation gas was set to 150 mole ppm.

Example 5

A passivation film was deposited on the surface of a substrate in the same manner as in Example 1, except that, as the sample 20, a sample in which a silicon oxide film with a thickness of 150 nm was formed on a silicon substrate and a molybdenum film with a thickness of 80 nm was further formed on top of the silicon oxide film was used.

Example 6

A passivation film was deposited on the surface of a substrate in the same manner as in Example 5, except that the concentration of oxygen gas in a passivation gas was set to 30 mole ppm.

Example 7

A passivation film was deposited on the surface of a substrate in the same manner as in Example 5, except that the concentration of oxygen gas in a passivation gas was set to 3.8 mole ppm.

Example 8

A passivation film was deposited on the surface of a substrate in the same manner as in Example 5, except that the concentration of oxygen gas in a passivation gas was set to 0.75 mole ppm.

Comparative Example 3

A passivation film was deposited on the surface of a substrate in the same manner as in Example 5, except that the concentration of oxygen gas in a passivation gas was set to 75 mole ppm.

Comparative Example 4

A passivation film was deposited on the surface of a substrate in the same manner as in Example 5, except that the concentration of oxygen gas in a passivation gas was set to 150 mole ppm.

For samples 20 on which the passivation films were deposited in Examples 1 to 8 and Comparative Examples 1 to 4, the surface state of a germanium film or a molybdenum film on which a passivation film was formed was analyzed by time-of-flight secondary ion mass spectrometry (TOF-SIMS). The amounts of germanium oxide (GeOx), germanium sulfide (GeSx), molybdenum oxide (MoOx), and molybdenum sulfide (MoSx) in each passivation film are illustrated in Tables 1 and 2 and graphs in FIG. 2 and FIG. 3.

TABLE 1

|  | Example 1 | Example 2 | Example 3 | Example 4 | Comparative Example 1 | Comparative Example 2 |
|---|---|---|---|---|---|---|
| Oxygen gas concentration (mole ppm) | 60 | 30 | 3.8 | 0.75 | 75 | 150 |
| GeOx amount (arbitrary unit) | 516 | 472 | 385 | 292 | 827 | 1821 |
| GeSx amount (arbitrary unit) | 822 | 936 | 1408 | 1507 | 390 | 384 |
| GeOx/GeSx ratio | 0.63 | 0.50 | 0.27 | 0.19 | 2.12 | 4.74 |

TABLE 2

| | Example 5 | Example 6 | Example 7 | Example 8 | Comparative Example 3 | Comparative Example 4 |
|---|---|---|---|---|---|---|
| Oxygen gas concentration (mole ppm) | 60 | 30 | 3.8 | 0.75 | 75 | 150 |
| MoOx amount (arbitrary unit) | 501 | 430 | 424 | 272 | 852 | 1639 |
| MoSx amount (arbitrary unit) | 748 | 833 | 1211 | 1266 | 382 | 357 |
| MoOx/MoSx ratio | 0.67 | 0.52 | 0.35 | 0.21 | 2.23 | 4.59 |

Figure 2:
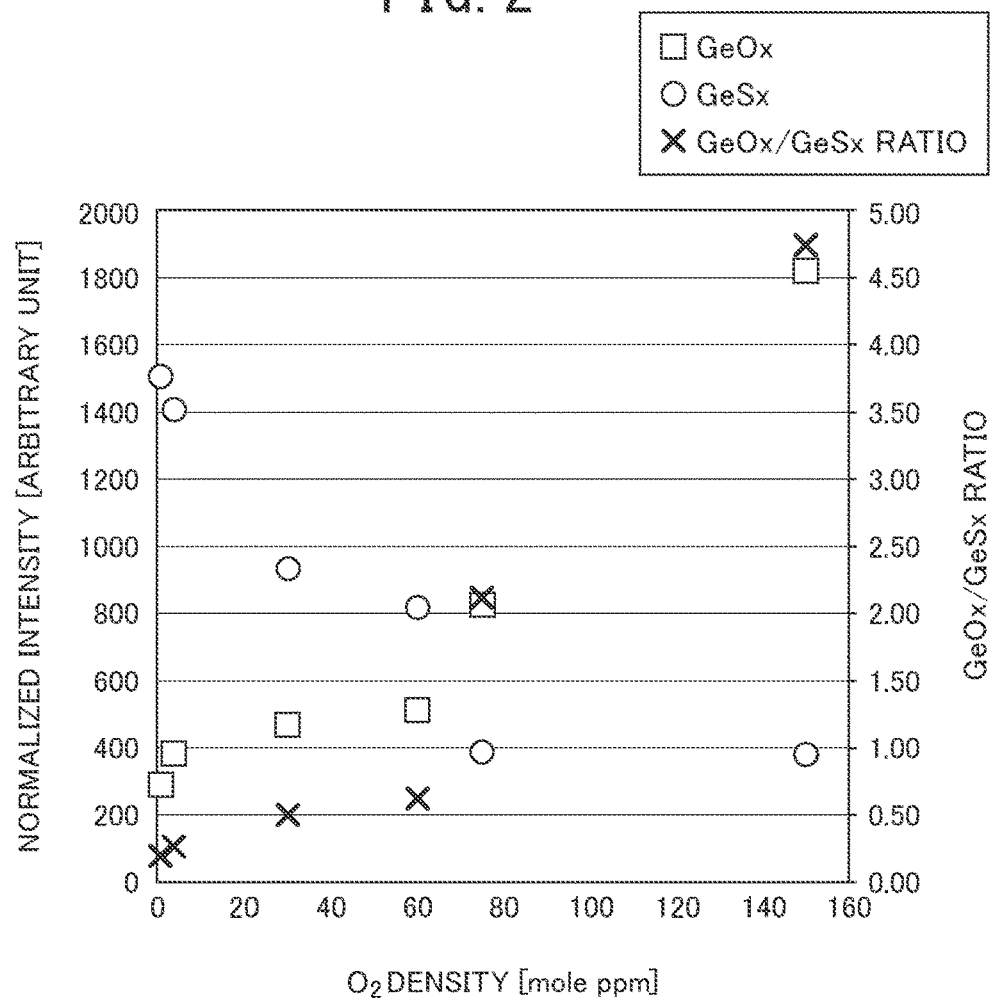
FIG. 2 is a graph illustrating an analysis result of surface states of a germanium film on which a passivation film is formed.

As can be seen from Tables 1 and 2 and the graphs in FIGS. 2 and 3, Comparative Examples 1, 2, 3, and 4, in which the concentration of oxygen gas in the passivation gas is 75 mole ppm or higher, had a large ratio of the amount of oxide to the amount of sulfide in the passivation film of the sample 20. In contrast, for Examples 1 to 8, in which the concentration of oxygen gas in the passivation gas was less than 75 mole ppm, the ratio of the amount of oxide to the amount of sulfide in the passivation film of the sample 20 was considerably smaller than that of Comparative Examples, indicating the existence of critical conditions between Examples and Comparative Examples. As described above, it was found that a sulfide film can be deposited while suppressing generation of an oxide film by using a passivation gas with a low concentration of oxygen gas.

REFERENCE SIGNS LIST

1 Film deposition system
10 Chamber
11 Stage
12 Passivation gas supply piping
13 Inert gas supply piping
15 Exhaust piping
20 Sample

The invention claimed is:

1. A method of manufacturing a passivation film, the method comprising
a passivation process in which a substrate on the surface of which at least one of germanium and molybdenum is contained is treated with a passivation gas containing an oxygen-containing compound, which is a compound containing an oxygen atom in a molecule, and hydrogen sulfide to form a passivation film containing a sulfur atom on the surface of the substrate, wherein
concentration of the oxygen-containing compound in the passivation gas is from 0.001 mole ppm to less than 75 mole ppm.

2. The method of manufacturing a passivation film according to claim 1, wherein the concentration of the oxygen-containing compound in the passivation gas is from 0.5 mole ppm to 65 mole ppm.

3. The method of manufacturing a passivation film according to claim 1, wherein the oxygen-containing compound is at least one of oxygen gas and water.

4. The method of manufacturing a passivation film according to claim 1, wherein the substrate comprises a film containing at least one of germanium and molybdenum on the surface of the substrate.

5. The method of manufacturing a passivation film according to claim 1, wherein the substrate is treated with the passivation gas under conditions of a temperature of from 20° C. to 1,500° C. and a pressure of from 1 Pa to 101 kPa.

6. The method of manufacturing a passivation film according to claim 2, wherein the oxygen-containing compound is at least one of oxygen gas and water.

7. The method of manufacturing a passivation film according to claim 2, wherein the substrate comprises a film containing at least one of germanium and molybdenum on the surface of the substrate.

8. The method of manufacturing a passivation film according to claim 3, wherein the substrate comprises a film containing at least one of germanium and molybdenum on the surface of the substrate.

9. The method of manufacturing a passivation film according to claim 2, wherein the substrate is treated with the passivation gas under conditions of a temperature of from 20° C. to 1,500° C. and a pressure of from 1 Pa to 101 kPa.

10. The method of manufacturing a passivation film according to claim 3, wherein the substrate is treated with the passivation gas under conditions of a temperature of from 20° C. to 1,500° C. and a pressure of from 1 Pa to 101 kPa.

11. The method of manufacturing a passivation film according to claim 4, wherein the substrate is treated with the passivation gas under conditions of a temperature of from 20° C. to 1,500° C. and a pressure of from 1 Pa to 101 kPa.

* * * * *